US009332205B2

(12) United States Patent
Fukuda

(10) Patent No.: US 9,332,205 B2
(45) Date of Patent: May 3, 2016

(54) IMAGE PICKUP ELEMENT, IMAGE PICKUP APPARATUS, AND IMAGE PROCESSING METHOD

(71) Applicant: CANON KABUSHIKI KAISHA, Tokyo (JP)

(72) Inventor: Koichi Fukuda, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/643,038

(22) Filed: Mar. 10, 2015

(65) Prior Publication Data
US 2015/0271425 A1    Sep. 24, 2015

(30) Foreign Application Priority Data

Mar. 24, 2014 (JP) ................................. 2014-060086

(51) Int. Cl.
| | |
|---|---|
| H04N 5/378 | (2011.01) |
| H04N 5/225 | (2006.01) |
| G02B 13/00 | (2006.01) |
| G02B 6/42 | (2006.01) |
| G02B 5/20 | (2006.01) |

(52) U.S. Cl.
CPC ................. H04N 5/378 (2013.01); G02B 5/20 (2013.01); G02B 5/201 (2013.01); G02B 6/42 (2013.01); G02B 6/421 (2013.01); G02B 6/4204 (2013.01); G02B 13/0015 (2013.01); H04N 5/2254 (2013.01)

(58) Field of Classification Search
CPC ... H04N 5/378; H04N 5/2254; H04N 5/2253; H01L 27/14627; G02B 6/42; G02B 6/421; G02B 6/4204; G02B 5/201; G02B 5/20; G02B 13/0015
See application file for complete search history.

(56) References Cited

U.S. PATENT DOCUMENTS

| | | | | |
|---|---|---|---|---|
| 4,410,804 | A | 10/1983 | Stauffer | |
| 8,319,882 | B2 * | 11/2012 | Fujii | G02B 7/28 348/343 |
| 9,237,281 | B2 * | 1/2016 | Fukuda | H01L 27/14627 |
| 2011/0063484 | A1 * | 3/2011 | Fujii | G02B 7/28 348/294 |
| 2013/0015545 | A1 * | 1/2013 | Toumiya | H01L 27/14605 257/432 |

FOREIGN PATENT DOCUMENTS

| | | |
|---|---|---|
| JP | 2001-083407 A | 3/2001 |
| JP | 2008-299184 A | 12/2008 |

OTHER PUBLICATIONS

Ren Ng, et al., "Light Field Photography with a Hand-Held Plenoptic Camera", Stanford Tech Report CTSR Feb. 2005.

* cited by examiner

*Primary Examiner* — Luong T Nguyen
(74) *Attorney, Agent, or Firm* — Cowan, Liebowitz & Latman, P.C.

(57) ABSTRACT

An image pickup element includes a pixel matrix, a pupil dividing portion, and a shielding portion. Pixels in the pixel matrix include a photoelectric conversion portion, and are arranged in units of a matrix of a predetermined number of the pixels. The pupil dividing portion is arranged on a side of a light receiving surface of the photoelectric conversion portion of each pixel to divide a pupil region. The shielding portion arranged between the pupil dividing portion and the photoelectric conversion portion shields a predetermined region of the light receiving surface of the photoelectric conversion portion. The predetermined region of each pixel corresponds to any one of the divided pupil regions obtained when the pupil region is divided by the pupil dividing portion. A proportion of the predetermined region is smaller than a proportion of a region not-shielded by the shielding portion in the light receiving surface.

8 Claims, 13 Drawing Sheets

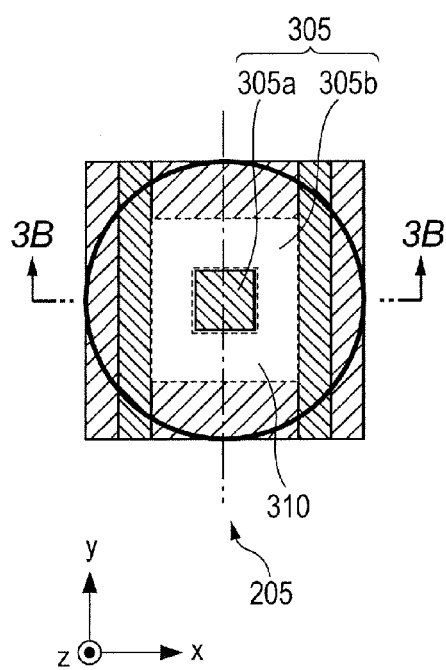
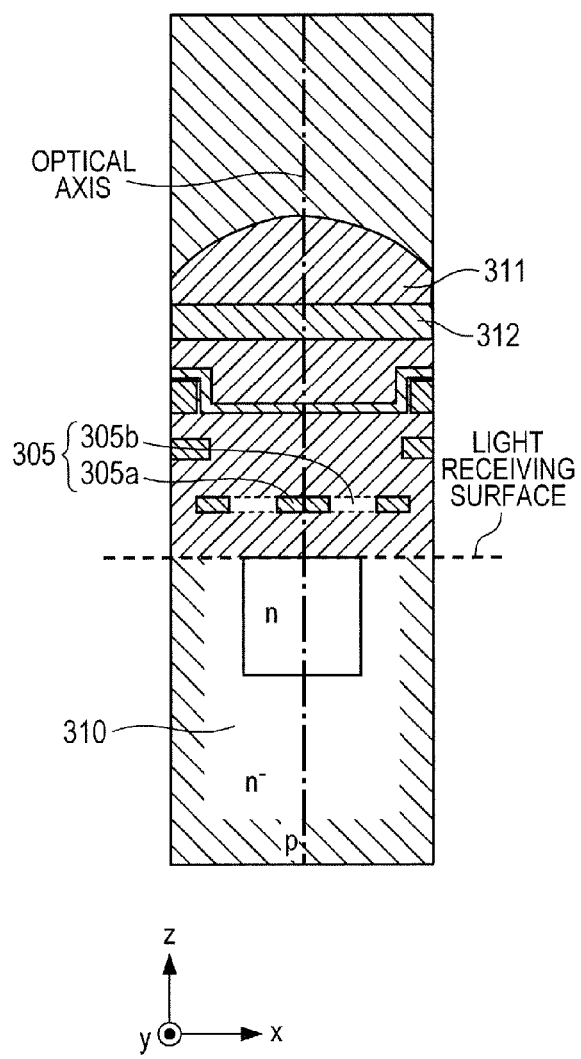

PLAN VIEW 14B-14B CROSS-SECTIONAL VIEW

IMAGE PICKUP ELEMENT, IMAGE PICKUP APPARATUS, AND IMAGE PROCESSING METHOD

BACKGROUND OF THE INVENTION

1. Field of the Invention

The present invention relates to an image pickup element and an image pickup apparatus, in particular, an image pickup element capable of obtaining a plurality of parallax image signals, and an image pickup apparatus including the image pickup element.

2. Description of the Related Art

In the related art, there has been proposed an image pickup apparatus in which an exit pupil of a photographing lens is divided into a plurality of regions so that a plurality of parallax images corresponding to the pupil regions obtained by the division are photographed simultaneously.

U.S. Pat. No. 4,410,804 discloses an image pickup apparatus using a two-dimensional image pickup element in which one microlens and a plurality of divided photoelectric conversion portions are formed for one pixel. The divided photoelectric conversion portions are configured to receive light from different pupil subregions of the exit pupil of the photographing lens through one microlens to divide the pupil. Respective signals obtained by receiving the light by the divided photoelectric conversion portions generate a plurality of parallax images corresponding to the pupil subregions. Japanese Patent Application Laid-Open No. 2001-083407 discloses adding all signals, which are obtained by receiving light by divided photoelectric conversion portions in a pixel, to generate a picked-up image of a subject.

A plurality of photographed parallax images are equivalent to Light Field (LF) data, which is information on a space distribution and an angle distribution of light intensities. Stanford Tech Report CTSR 2005-02, 1 (2005) discloses a refocusing technology in which a synthetic image at a virtual imaging plane, which is different from an image pickup plane, is rendered by using obtained LF data to change a focus position of the picked-up image after photographing.

Japanese Patent Application Laid-Open No. 2008-299184 discloses an image pickup apparatus using an image pickup element. The image pickup element includes a shielding layer including aperture portions formed between a microlens and a light receiving surface of a photoelectric conversion portion of each pixel to shield light in most (a half or more) of the region excluding a part of the light receiving surface. Japanese Patent Application Laid-Open No. 2008-299184 discloses an image pickup element configured to decenter aperture portions of the shielding layer in a predetermined pattern for each pixel included in a set of pixels to receive light from different pupil subregions of the exit pupil of the photographing lens. In this manner, the exit pupil of the photographing lens is divided to photograph a plurality of parallax images corresponding to the pupil subregions obtained by the division. Such pixel configuration may be formed by utilizing a wiring layer to form the shielding layer including the aperture portions in a normal imaging pixel. It produces the image pickup element, which obtains the plurality of parallax images with a simple structure.

SUMMARY OF THE INVENTION

According to one embodiment of the present invention, there is provided an image pickup element, including: a pixel matrix in which a plurality of pixels each including a photoelectric conversion portion for photoelectrically converting an optical image of a subject, which is formed by an imaging optical system, are arranged in units of a matrix of a predetermined number of the pixels; a pupil dividing portion arranged on a side of a light receiving surface of the photoelectric conversion portion of each of the pixels to divide a pupil region of the imaging optical system; and a shielding portion arranged between the pupil dividing portion and the photoelectric conversion portion of each of the pixels to shield a predetermined region of the light receiving surface of the photoelectric conversion portion, in which the predetermined region of each of the pixels included in the matrix of the predetermined number of the pixels corresponds to any one of the predetermined number of divided pupil regions obtained when the pupil region is divided by the pupil dividing portion, and a proportion of the predetermined region in the light receiving surface is smaller than a proportion of a region that is not shielded by the shielding portion in the light receiving surface.

Further features of the present invention will become apparent from the following description of exemplary embodiments with reference to the attached drawings.

BRIEF DESCRIPTION OF THE DRAWINGS

FIGS. 3A and 3B are a schematic plan view and a schematic cross-sectional view, respectively, of a subpixel of the image pickup element according to the first embodiment of the present invention.

DESCRIPTION OF THE EMBODIMENTS

Preferred embodiments of the present invention will now be described in detail in accordance with the accompanying drawings.

The related-art image pickup element shields light in most (more than a half) of the region excluding a part of the light receiving surface of the photoelectric conversion portion of each pixel to divide the pupil. Hence, there is a problem in that a light receiving sensitivity of the image pickup element is significantly reduced. Therefore, the present invention has been made in view of the above-mentioned problem, and has an object to provide an image pickup element, which forms a shielding layer in a light receiving surface of a photoelectric conversion portion in each pixel to divide a pupil, and is capable of obtaining a plurality of parallax images while suppressing a reduction in light receiving sensitivity, and an image pickup apparatus. Embodiments of the present invention are described in detail with reference to the accompanying drawings.

[First Embodiment]

A first embodiment of the present invention is described with reference to FIGS. 1 to 12.

Figure 1:
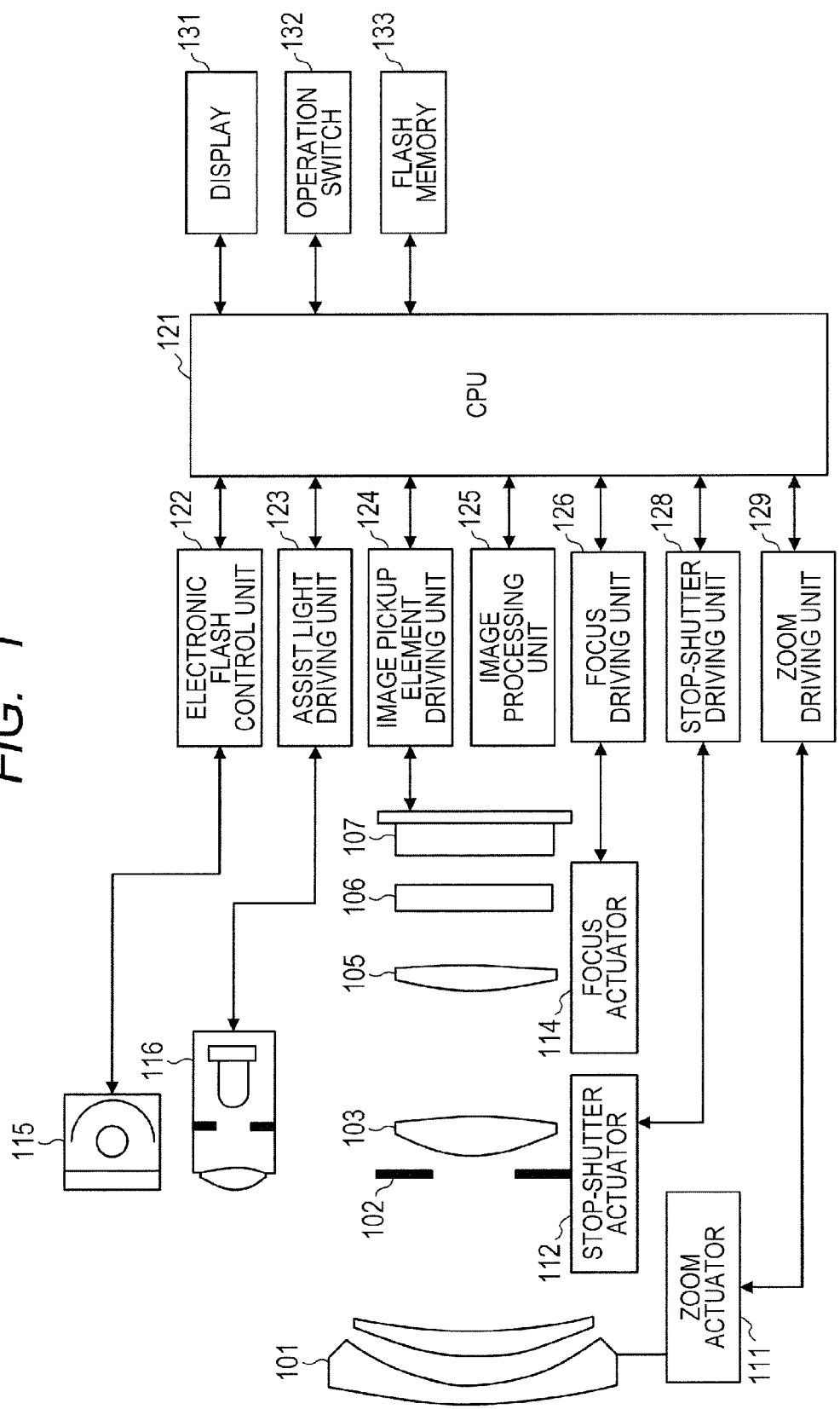
FIG. 1 is a schematic configuration diagram of an image pickup apparatus to which an image pickup element according to a first embodiment of the present invention is applied.

FIG. 1 is a diagram illustrating a configuration of a camera as an image pickup apparatus to which an image pickup element according to this embodiment is applied. The image pickup apparatus may be an image pickup apparatus integrated with a lens as illustrated in FIG. 1, or may consist of a lens apparatus including an imaging optical system for forming an optical image of a subject, and an image pickup apparatus main body including the image pickup element to which the lens apparatus is detachably attached.

In FIG. 1, a first lens unit 101 is arranged at a leading end of the imaging optical system, and is held to be extendable and retractable in an optical axis direction. A stop shutter 102 adjusts its aperture diameter to adjust an amount of light during photography, and has a shutter function for adjusting exposure time in seconds while photographing a still image. A second unit is denoted by 103. The aperture shutter 102 and the second lens unit 103 integrally extend and retract in the optical axis direction, and exert a zooming action (zoom function) in combination with the extending and retracting operation of the first lens unit 101.

A third lens unit 105 extends and retracts in the optical axis direction to adjust a focus. An optical low-pass filter 106 is an optical element for reducing false color and moire in a photographed image. An image pickup element 107 consists of a two-dimensional complementary metal oxide semiconductor (CMOS) photosensor and its periphery, and has a configuration according to this embodiment as described below.

A zoom actuator 111 rotates a cam barrel (not shown) to drive the first lens unit 101 or the second lens unit 103 to extend and retract in the optical axis direction and hence performs a zooming operation. A stop-shutter actuator 112 controls the aperture diameter of the stop shutter 102 to adjust the amount of light during photography, and performs an exposure time control while photographing the still image. A focus actuator 114 drives the third lens unit 105 to extend and retract in the optical axis direction and hence adjusts the focus.

An illumination unit 115 for use during photography is an electronic flash for illuminating the subject, and a photoflash device using a xenon tube is preferred, but an illumination device including a light emitting diode (LED) that sequentially emits light may also be used. An auto-focus (AF) assist light unit 116 projects an image of a mask having a predetermined aperture pattern on a field through a transmitter lens to improve focus detection capability for a dark subject or a subject having a low contrast.

A central processing unit (CPU) 121 is a CPU provided in a camera for controlling various aspects of the camera, and includes an arithmetic portion, a read-only memory (ROM), a random access memory (RAM), an analog-to-digital (A/D) converter, a digital-to-analog (D/A) converter, a communication interface portion, and the like. The CPU drives various units included in the camera based on a predetermined program stored in the ROM, and executes a series of operations such as AF, photographing, and image processing and storing.

An electronic flash control unit 122 performs a control to turn on the illumination unit 115 in synchronization with a photographing operation. An assist light driving unit 123 performs a control to turn on the AF assist light unit 116 in synchronization with a focus detection operation. An image pickup element driving unit 124 controls an image pickup operation of the image pickup element 107, and subjects an obtained image signal to an A/D conversion to be transmitted to the CPU 121. An image processing unit 125 performs processing such as gamma (γ) conversion, color interpolation, and JPEG compression on an image obtained by the image pickup element 107.

A focus driving unit 126 drives the focus actuator 114 based on a result of the focus detection, drives the third lens unit 105 to extend/retract in the optical axis direction, and as a result, adjusts the focus. A stop-shutter driving unit 128 drives the stop-shutter actuator 112, and hence controls the aperture of the stop shutter 102. A zoom driving unit 129 drives the zoom actuator 111 in response to a zoom operation by a photographer.

A display 131 such as a liquid crystal display displays information on photography modes of the camera, a preview image before photography, an image for confirmation after photography, an in-focus state display image during the focus detection, and the like. Operation switches 132 include a power switch, a release (photography trigger) switch, a zoom operation switch, a photography mode selection switch, and the like. A detachable flash memory 133 records the photographed image.

Figure 2:
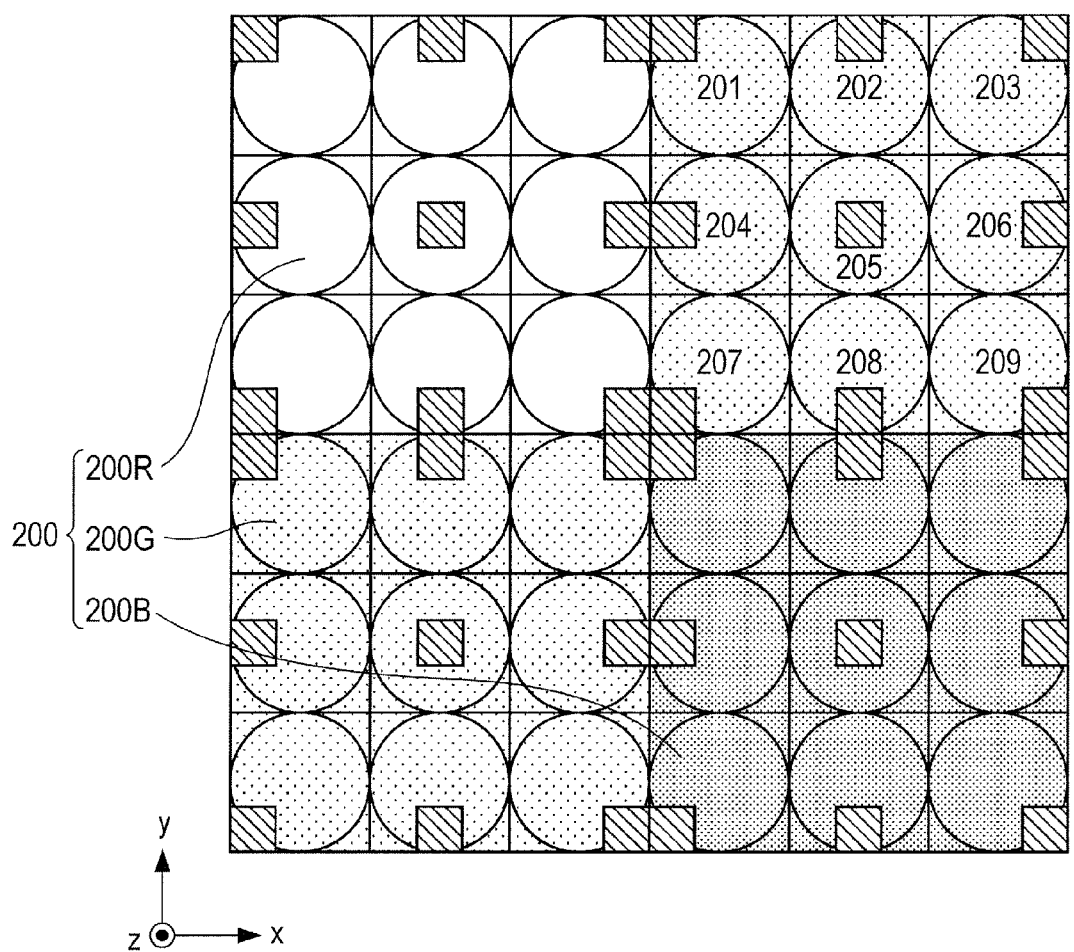
FIG. 2 is a schematic plan view of a pixel matrix of the image pickup element according to the first embodiment of the present invention.

A schematic plan view of FIG. 2 illustrates a pixel matrix of unit pixels forming the image pickup element 107 (two-dimensional CMOS sensor) in this embodiment and subpixels forming the unit pixels. FIG. 2 illustrates a matrix of unit pixels 200 of the image pickup element in this embodiment in a range of two rows by two columns. Each unit pixel 200 is formed of an array of a predetermined number of subpixels, and FIG. 2 illustrates an example in which one unit pixel consists of 3×3 subpixels 201 to 209. In an actual image pickup element, a large number of 2×2 unit pixels (6×6 subpixels) illustrated in FIG. 2 are arranged on an image pickup plane to allow a picked-up image of the subject to be obtained. In this embodiment, an image pickup element having a pixel period ΔX of 9 μm and the number of valid pixels of 4,000 columns in width by 2,667 rows in height, which totals 10,670,000 pixels (subpixel period Δx of 3 μm and the number of valid subpixels of 12,000 columns in width by 8,000 rows in height, which totals 96,000,000 subpixels) is described. However, a specific configuration scale of the image pickup element is not limited thereto.

In the group of 2×2 unit pixels 200 illustrated in FIG. 2, a unit pixel 200R having a spectral sensitivity of red (R) is arranged at the upper left position of the figure, unit pixels 200G having a spectral sensitivity of green (G) are arranged at the upper right and lower left, and a unit pixel 200B having a spectral sensitivity of blue (B) is arranged at the lower right. Further, each unit pixel is formed of a two-dimensional matrix of N1×N2 (3×3) subpixels 201 to 209.

Taking as an example the subpixel 205 of the subpixels 201 to 209, which form one unit pixel 200G of the image pickup element illustrated in FIG. 2, a configuration of the subpixel of the image pickup element according to this embodiment is described with reference to FIGS. 3A and 3B. FIG. 3A is a plan view of the subpixel 205 when viewed from a light receiving surface side (+z side), and FIG. 3B is a cross-sectional view taken along the line 3B-3B of FIG. 3A when viewed from a −y side. The subpixels 201 to 204 and 206 to 209 other than the subpixel 205 are also the same except that an arrangement pattern of shielding portions of a shielding layer (to be described later) is different.

As illustrated in FIGS. 3A and 3B, the subpixel 205 of the image pickup element according to this embodiment includes a photoelectric conversion portion (photodiode) 310 having a pin structure in which an n⁻ intrinsic layer is interposed between a p-type layer and an n-type layer. The region of the photoelectric conversion portion 310 is a region of a depletion layer, which is formed in the n⁻ intrinsic layer illustrated in FIG. 3B and extends to the periphery by a diffusion length of a minority carrier, and generally overlaps a region obtained by combining the n⁻ intrinsic layer and the n-type layer. The n⁻ intrinsic layer may be omitted to obtain a pn junction photodiode as necessary.

The subpixel 205 includes a microlens 311 for condensing incident light on a light receiving side thereof, and a color filter 312 between the microlens 311 and the photoelectric conversion portion 310. Color filters having the same spectral sensitivity characteristic are arranged in the subpixels for each unit pixel. A spectral transmittance of the color filter may be changed for each subpixel, or the color filter may be omitted as necessary.

Further, the subpixel 205 includes a shielding layer 305 between the microlens 311 and the photoelectric conversion portion 310, the shielding layer 305 including an aperture portion 305b and a shielding portion 305a to shield a part of the light receiving surface of the photoelectric conversion portion 310. As illustrated in FIG. 3A, in this embodiment, the shielding layer 305 is configured so that an area of the aperture portion 305b is larger than an area of the shielding portion 305a. Note that, the shielding layer 305 may also serve as a wiring layer as necessary, and the use as both the shielding layer and the wiring layer may simplify a production process.

The light incident on the subpixel 205 illustrated in FIGS. 3A and 3B is condensed by the microlens 311 and dispersed by the color filter 312, and then a part of which is shielded by the shielding portion 305a of the shielding layer 305, and most of which is transmitted through the aperture portion 305b to be received by the photoelectric conversion portion 310. In this manner, in this embodiment, a proportion of the aperture portion 305b in the light receiving surface is larger than a proportion of the shielding portion 305a, and hence the reduction in light receiving sensitivity of the subpixel may be further suppressed.

In the photoelectric conversion portion 310, a pair of electrons and holes are generated depending on an amount of received light and separated by the depletion layer. Thereafter, the electrons having negative charges are stored in the n-type layer, and the holes having positive charges are discharged to outside the image pickup element through the p-type layer connected to a constant voltage source (not shown).

Figure 4:
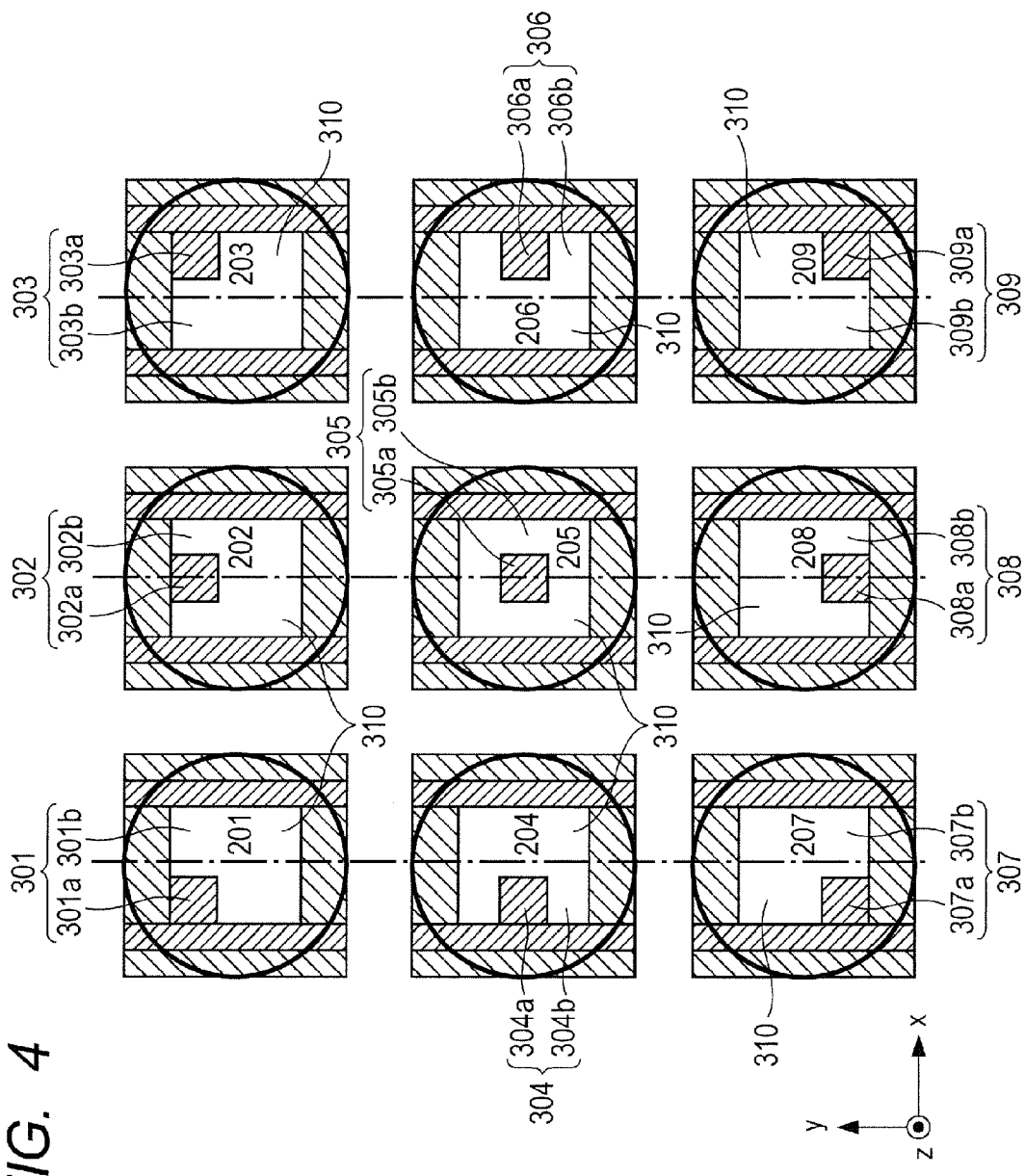
FIG. 4 is a schematic plan view of subpixels forming a unit pixel according to the first embodiment of the present invention.

FIG. 4 is a plan view when viewed from the light receiving surface side (+z side) of the image pickup element in a case where each of the subpixels 201 to 209 forming the pixel 200G illustrated in FIG. 2 is the subpixel having the configuration in this embodiment illustrated in FIGS. 3A and 3B. In FIG. 4, similar parts as those in FIGS. 2, 3A, and 3B are denoted by the same reference symbols. Shielding layers 301 to 309 are shielding layers formed in the subpixels 201 to 209, respectively. In FIG. 4, shielding portions 301a to 309a of the shielding layers 301 to 309 are respectively configured to shield different ones of N1×N2 (=9) subregions obtained by dividing the light receiving surface of the photoelectric conversion portion 310 by N1 (=3) in a longitudinal direction and N2 (=3) in a horizontal direction. Regions other than the shielding portions are configured as aperture portions 301b to 309b. In this manner, in this embodiment, the shielding layers are configured so that proportions of the aperture portions 301b to 309b in the light receiving surface of the photoelectric conversion portion 310 are larger than proportions of the shielding portions 301a to 309a.

Figure 5:
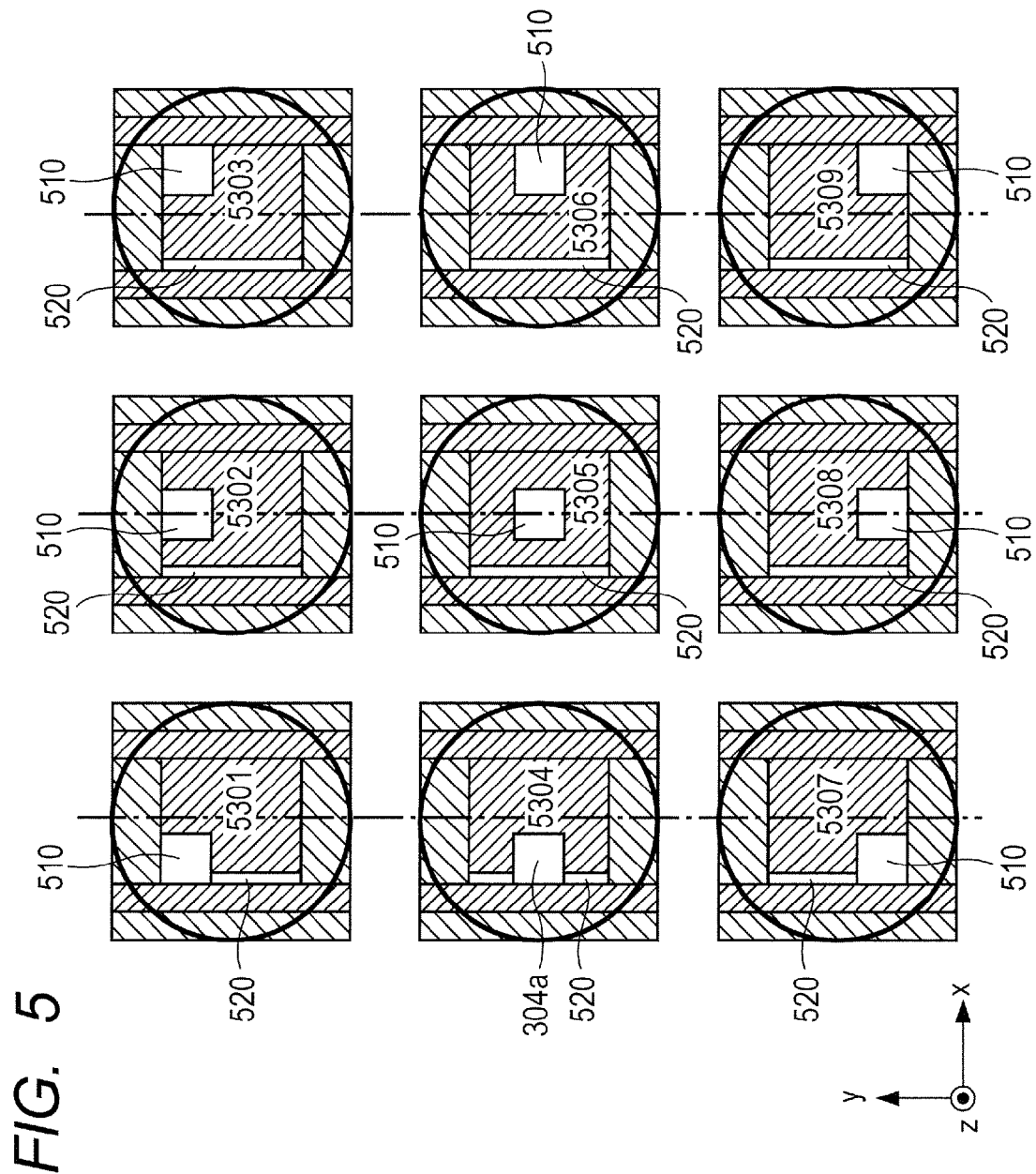
FIG. 5 is a schematic plan view of subpixels forming a unit pixel according to a related technology.

Here, for comparison with this embodiment, FIG. 5 is a plan view when viewed from the light receiving surface side (+z side) of the image pickup element in a case where each of the subpixels forming the unit pixel 200G is a related-art subpixel. In the related-art example, shielding layers 5301 to 5309 are formed in the subpixels. The shielding layers 5301 to 5309 include the aperture portions 510 and 520 and shielding portions, which are regions other than the aperture portions 510 and 520. The long rectangular aperture portion 520 formed on the left side of each of the shielding layers 5301 to 5309 is formed in order not to short-circuit two wires on the left and right. Moreover, the configuration of the subpixels concerning the related-art example is similar to that of this embodiment except for a layout of the shielding portions forming the shielding layers.

As apparent from FIG. 5, in the related-art example, in the shielding layers 5301 to 5309, the aperture portions 510 are respectively formed so as not to shield different subregions obtained in the case where the light receiving surface of the photoelectric conversion portion is divided by N1×N2 (=9). Therefore, in the related-art example, the shielding layers 5301 to 5309 are configured so that areas of the aperture portions 510 are smaller than areas of the shielding portions, which inevitably reduces a light receiving sensitivity of the subpixels.

More specifically, in the related-art example, a proportion of the shielding portions with respect to the light receiving surface of the photoelectric conversion portion is approximately 1−1/(N1×N2) (=8/9), and in contrast, a proportion of the aperture portions is as small as 1/(N1×N2) (=1/9), with the result that the light receiving sensitivity of the subpixels is significantly reduced.

On the other hand, in this embodiment, a proportion of the shielding portions with respect to the light receiving surface of the photoelectric conversion portion is approximately 1/(N1×N2) (=1/9), and a proportion of the aperture portions is as large as 1−1/(N1×N2) (=8/9), with the result that the reduction of the light receiving sensitivity of the subpixels may be significantly suppressed.

Next, with reference to FIGS. 6 to 10, a pupil dividing portion in the image pickup element and generation of the parallax images according to this embodiment are described.

Figure 6:
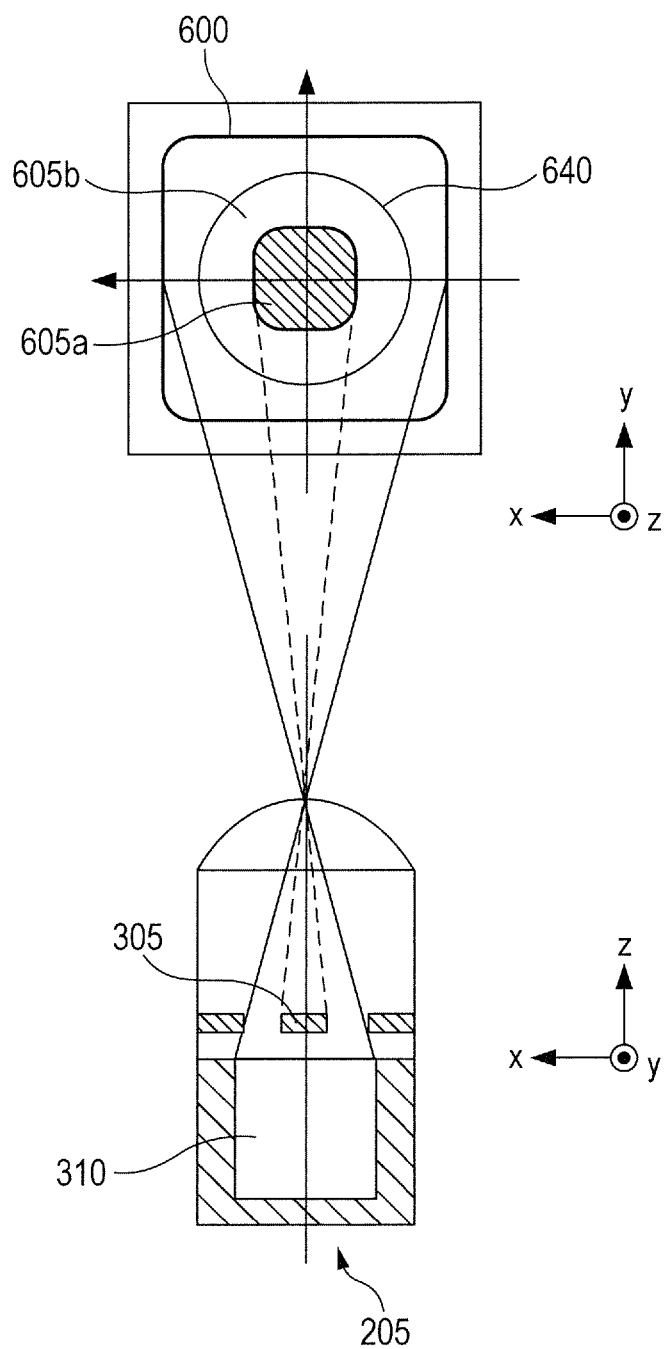
FIG. 6 is a diagram illustrating a correspondence of a subpixel with a light receiving pupil subregion and a non-light receiving pupil subregion of the image pickup element according to the first embodiment of the present invention.

FIG. 6 is a diagram illustrating a light receiving pupil subregion and a non-light receiving pupil subregion of the subpixel according to this embodiment, taking the subpixel 205 illustrated in FIGS. 3A and 3B as an example. The figure is a cross-sectional view of the subpixel 205 illustrated in FIG. 3B taken along the line 3B-3B in FIG. 3A when viewed from a +y side, and also illustrates an exit pupil surface of the imaging optical system. In FIG. 6, in correspondence to coordinate axes of the exit pupil surface, an x axis and a y axis in the cross-sectional view of the subpixel are inverted to those in FIGS. 3A and 3B.

In the image pickup apparatus, the image pickup element is arranged in proximity to an imaging surface of a photographing lens (imaging optical system), and a light beam from the subject is transmitted through an exit pupil of the imaging optical system to enter the subpixel.

In FIG. 6, an imaging pupil region 600 is generally in a conjugate relationship with the light receiving surface of the photoelectric conversion portion 310 through the microlens, and is a pupil region from which light can be received by the photoelectric conversion portion 310 of the subpixel in a case where the shielding layer 305 is absent. The imaging pupil region 600 is configured to make a light receiving region as large as possible in order to receive more of the light beam that passes through an exit pupil 640 of the imaging optical system, and a center of the imaging pupil region 600 substantially coincides with the optical axis.

A non-light receiving pupil subregion 605a is generally in a conjugate relationship with the shielding portion 305a of the shielding layer 305 through the microlens, and is a pupil subregion from which light is not received by the subpixel 205 due to the shielding by the shielding layer 305.

On the other hand, a light receiving pupil subregion 605b is generally in a conjugate relationship with the aperture portion 305b of the shielding layer 305 through the microlens, and is a pupil subregion, which is not shielded by the shielding layer 305 and from which light is received by the subpixel 205.

The exit pupil 640 changes in accordance with an aperture value of the imaging optical system and an image height of the subpixel, and a common region of the exit pupil 640 and the light receiving pupil subregion 605b becomes the light receiving pupil subregion from which light is received by the subpixel 205 in accordance with the aperture value of the imaging optical system. Therefore, each of the shielding portions 301a to 309a in the plurality of subpixels forming the unit pixel illustrated in FIG. 4 corresponds to any one of the divided pupil regions of the exit pupil 640, and the aperture portion corresponds to the remaining plurality of divided pupil regions. In the related-art example illustrated in FIG. 5, the aperture portion 510 corresponds to any one of the divided pupil regions, and hence it is possible to generate a parallax image corresponding to one divided pupil region with a photoelectric conversion output of the light received by the aperture portion. On the other hand, in this embodiment, the aperture portions 510 in the related-art technology are the shielding portions 301a to 309a, and hence parallax image signals are not obtained directly from the output of the subpixels. Therefore, in this embodiment, signals of the aperture portions 301b to 309b are subjected to image processing to generate a pixel signal of a parallax image corresponding to one of the divided pupil regions as described below. In this manner, the parallax image signals may be obtained while significantly suppressing the reduction in light receiving sensitivity of the subpixels.

Figure 7:
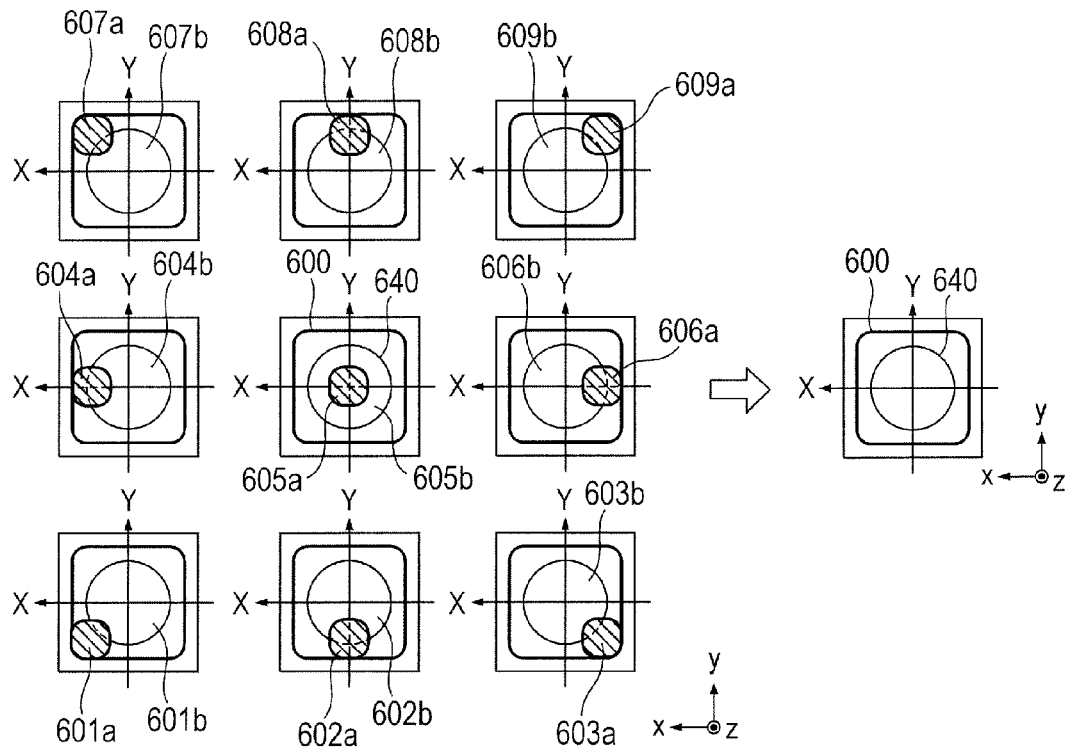
FIG. 7 is a diagram illustrating a correspondence of a plurality of the subpixels forming the unit pixel with light receiving pupil subregions and non-light receiving pupil subregions according to the first embodiment of the present invention.

FIG. 7 is a schematic plan view of light receiving pupil subregions and non-light receiving pupil subregions of the subpixels 201 to 209 forming the unit pixel 200G in this embodiment. Relationships of the light receiving pupil subregions and the non-light receiving pupil subregions in the subpixels 201 to 204 and 206 to 209 other than the subpixel 205 are similar to that of the subpixel 205 in FIG. 6.

The non-light receiving pupil subregions 601a to 609a in FIG. 7 are generally in conjugate relationships with the shielding portions of the shielding layers 301 to 309 through microlenses, respectively, and are pupil subregions from which light is not received by the subpixels 201 to 209, respectively. A configuration in which all of the non-light receiving pupil subregions 601a to 609a are added to form the imaging pupil region 600 is adopted.

On the other hand, the light receiving pupil subregions 601b to 609b in FIG. 7 are generally in conjugate relationships with the aperture portions of the shielding layers 301 to 309 through the microlenses, respectively, and are pupil subregions from which light is received by the subpixels 201 to 209, respectively.

In this embodiment, a proportion of the shielding portions in the light receiving surface of the photoelectric conversion portion is approximately $1/(N1 \times N2)$ (=1/9), and a proportion of the aperture portions, which is $1-1/(N1 \times N2)$ (=8/9), is larger. Therefore, each of the light receiving pupil subregions 601b to 609b is configured to be larger than each of the non-light receiving pupil subregions 601a to 609a, and hence may achieve the suppression of the reduction in light receiving sensitivity.

As illustrated in FIG. 7, the light receiving pupil subregions 601b to 609b from which light is received by the subpixels 201 to 209 forming each of the unit pixels of the image pickup element according to this embodiment respectively establish relationships of the following Expressions (1-1) to (1-9).

(Light receiving pupil subregion 601b)=(imaging pupil region 600)−(non-light receiving pupil subregion 601a)     Expression (1-1):

(Light receiving pupil subregion 602b)=(imaging pupil region 600)−(non-light receiving pupil subregion 602a)     Expression (1-2):

(Light receiving pupil subregion 603b)=(imaging pupil region 600)−(non-light receiving pupil subregion 603a)     Expression (1-3):

(Light receiving pupil subregion 604b)=(imaging pupil region 600)−(non-light receiving pupil subregion 604a)     Expression (1-4):

(Light receiving pupil subregion 605b)=(imaging pupil region 600)−(non-light receiving pupil subregion 605a)     Expression (1-5):

(Light receiving pupil subregion 606b)=(imaging pupil region 600)−(non-light receiving pupil subregion 606a)     Expression (1-6):

(Light receiving pupil subregion 607b)=(imaging pupil region 600)−(non-light receiving pupil subregion 607a)     Expression (1-7):

(Light receiving pupil subregion 608b)=(imaging pupil region 600)−(non-light receiving pupil subregion 608a)     Expression (1-8):

(Light receiving pupil subregion 609b)=(imaging pupil region 600)−(non-light receiving pupil subregion 609a)     Expression (1-9):

From the relationships of Expressions (1-1) to (1-9) and the fact that all of the non-light receiving pupil subregions 601a to 609a are added to form the imaging pupil region 600, all of the light receiving pupil subregions 601b to 609b are added to establish a relationship of the following Expression (2).

(Sum of the light receiving pupil subregions 601b to 609b)=(N1×N2−1)×(imaging pupil region 600)   Expression (2):

Therefore, all of the signals of the subpixels 201 to 209 may be added for each of the unit pixels to generate a pixel signal of an image having a resolution of the number of valid pixels. The generated pixel signal may be standardized by (N1×N2−1) as necessary.

Figure 8:
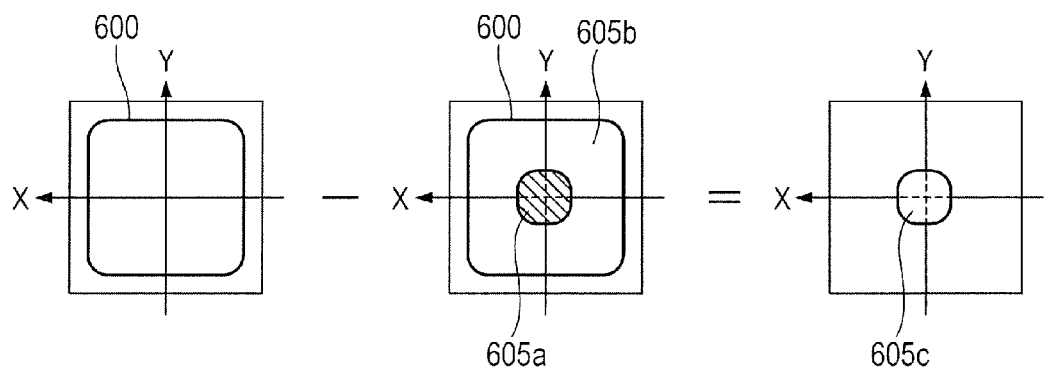
FIG. 8 is a diagram illustrating a concept of obtaining a parallax image signal by the image pickup element according to the first embodiment of the present invention.

Further, as illustrated in FIG. 8, (N1×N2−1) times the light receiving pupil subregion 605b may be subtracted from the sum of the light receiving pupil subregions 601b to 609b to obtain (N1×N2−1) times the non-light receiving pupil subregion 605a (605c). This may also be standardized by (N1×N2−1) as necessary. From the above description, the pixel signal of the parallax image corresponding to one of the divided pupil regions may be obtained from the output of the image pickup element according to this embodiment.

Next, the obtainment of the pixel signal of the parallax image described above is described in relation to pupil intensity distributions. In the actual image pickup element, while an eye relief is several tens of mm, a diameter of the microlens is several μm. Therefore, an aperture value of the microlens becomes several tens of thousands, and diffraction blur at a level of several tens of mm is generated. Therefore, the imaging pupil region 600, the non-light receiving pupil subregions 601a to 609a, and the light receiving pupil subregions 601b to 609b do not become clear regions but form the pupil intensity distributions (light receiving efficiency distributions).

Figure 9:
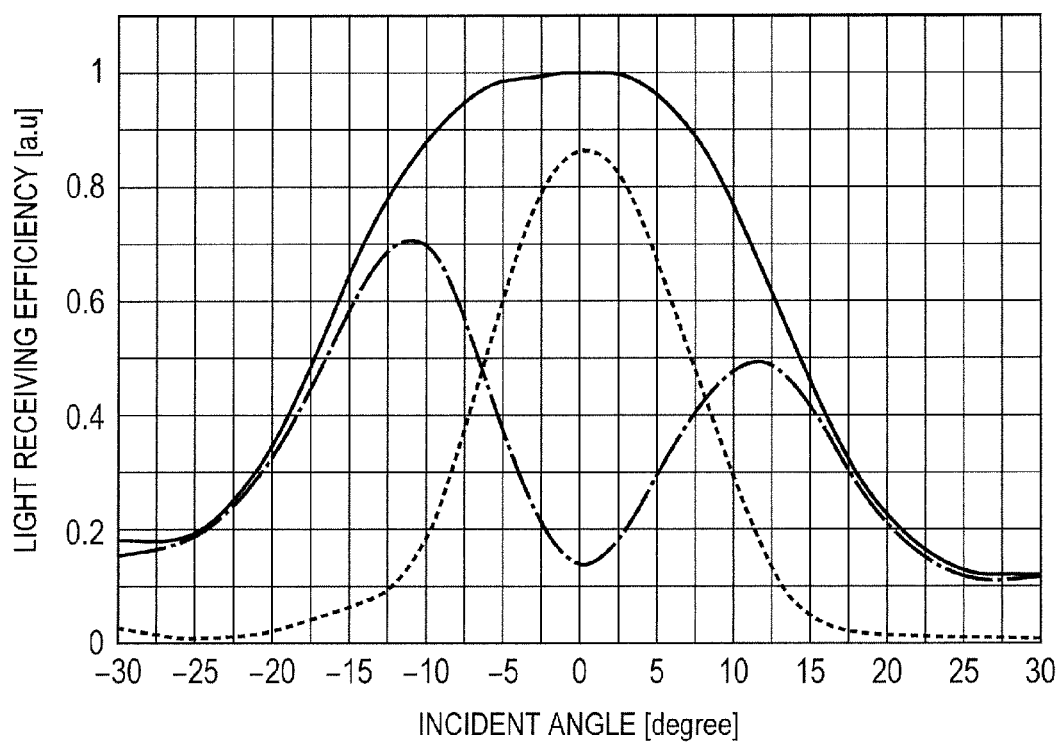
FIG. 9 is a graph showing an example of pupil intensity distributions of the subpixel of the image pickup element according to the first embodiment of the present invention.

FIG. 9 shows an example of the pupil intensity distributions corresponding to the concept of obtaining the parallax image signal illustrated in FIG. 8. The horizontal axis in FIG. 9 indicates the incident angle on the subpixel, and corresponds to the X axis of the pupil coordinate in FIG. 8 converted and inverted in accordance with the eye relief. A pupil intensity distribution corresponding to the light receiving pupil subregion 605b (the alternate short and long dash line in FIG. 9) may be subtracted from a pupil intensity distribution corresponding to the imaging pupil region 600 (the solid line in FIG. 9) to obtain a pupil intensity distribution corresponding to the non-light receiving pupil subregion 605a (the dotted line in FIG. 9).

Figure 10:
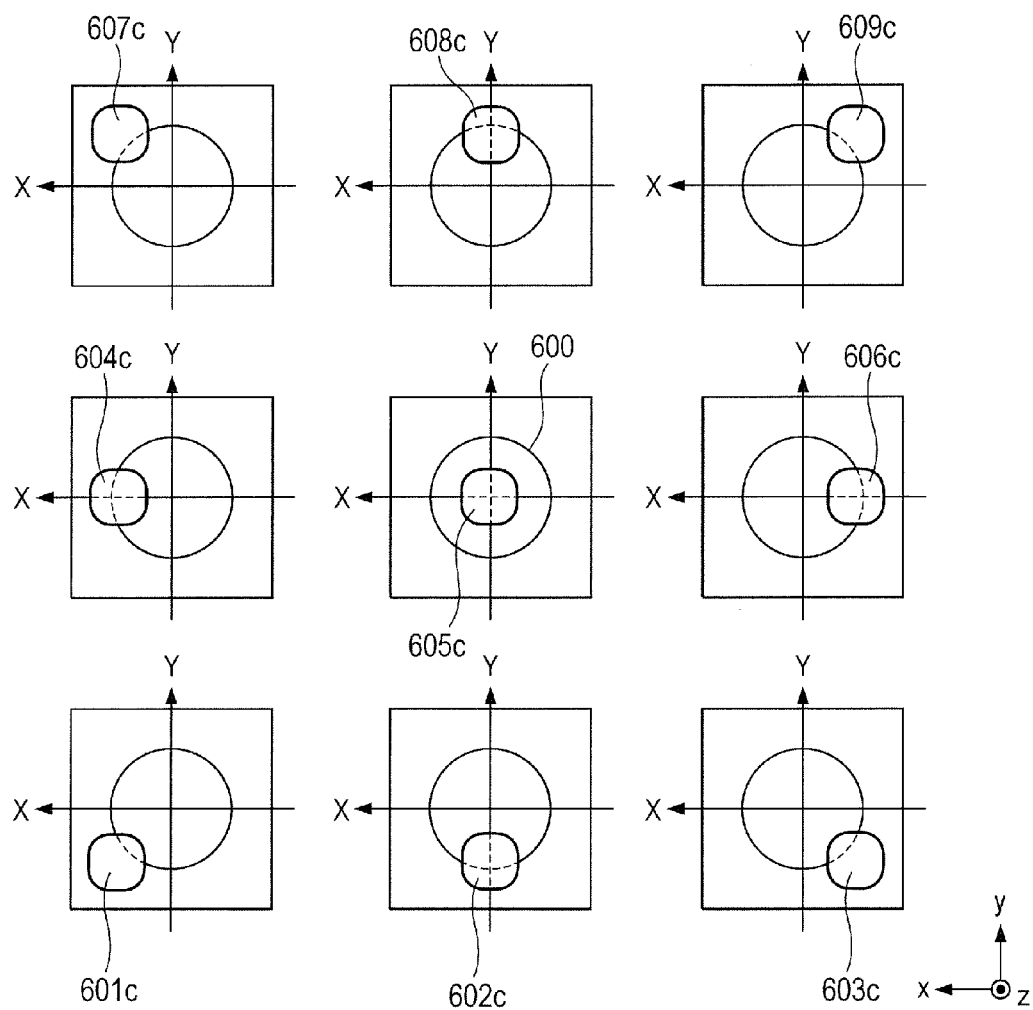
FIG. 10 is a schematic plan view of pupil divisions of the subpixels forming the unit pixel of the image pickup element according to the first embodiment of the present invention.

Similarly, (N1×N2−1) times any one of the light receiving pupil subregions 601b to 609b may be subtracted from the sum of the light receiving pupil subregions 601b to 609b to obtain (N1×N2−1) times each of the non-light receiving pupil subregions 601c to 609c illustrated in FIG. 10.

Next, a case where the obtainment of the pixel signal of the parallax image described above is realized by a processing operation of the image pickup apparatus according to this embodiment is described. Note that, this embodiment adopts a configuration in which an obtainment processing function of the parallax image signal is assigned to the image processing unit 125 or the CPU 121 of the image pickup apparatus, but may adopt a configuration in which the function is executed in another information processing apparatus such as a personal computer (PC) capable of obtaining the output of the image pickup apparatus. In that case, the present invention is realized as an image processing method, a computer program for executing the image processing method, or a computer-readable storage medium having the program stored thereon.

Figure 11:
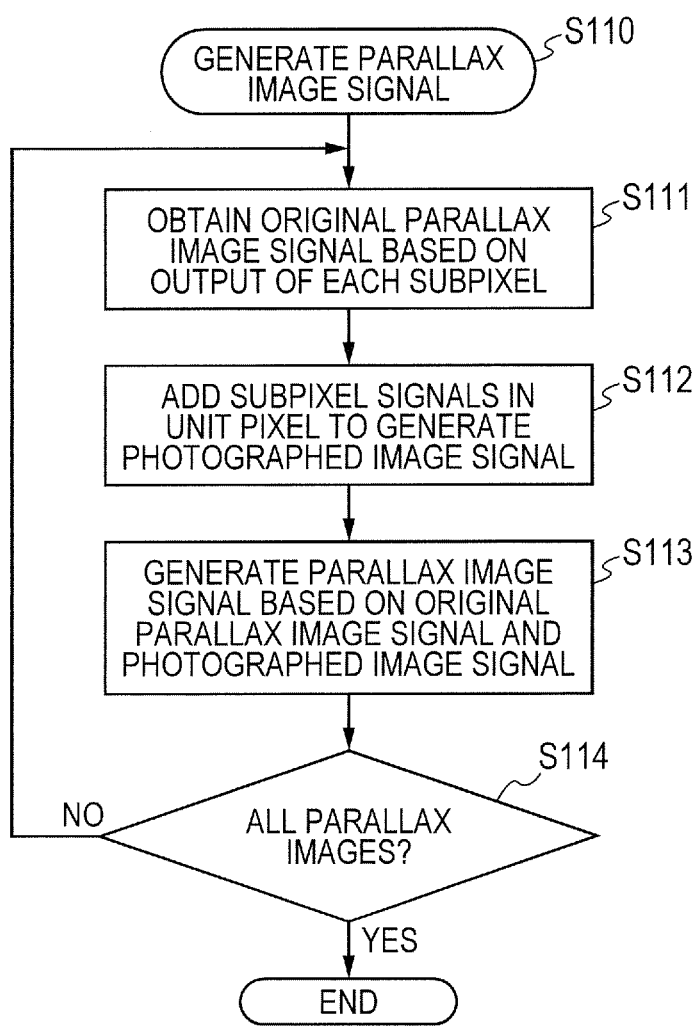
FIG. 11 is a flow chart of a parallax image generation operation of the image pickup apparatus to which the image pickup element according to the first embodiment of the present invention is applied.

FIG. 11 is referenced to describe the processing operation in which the pixel signal of the parallax image is obtained from the pixel output of the image pickup element according to this embodiment. FIG. 11 is a flow chart of the processing operation.

First, in Step S111, a signal of one of the subpixels (photoelectric conversion portions) 201 to 209 is obtained for each unit pixel. In this manner, a pixel signal of an original parallax image corresponding to any one of the pupil subregions 601b to 609b of the imaging optical system is obtained. For example, for each unit pixel, a signal of the subpixel 203 may be selected to obtain the pixel signal of the original parallax image having a resolution of the number of valid pixels corresponding to the pupil subregion 603b of the imaging optical system. This also applies to the other subpixels.

Next, in Step S112, all signals of the subpixels 201 to 209 are added for each unit pixel to generate pixel signals of the photographed image of the subject, which has a resolution of the number of valid pixels.

Finally, in Step S113, for each unit pixel, signals obtained by multiplying the pixel signals of each original parallax images, which are generated in Step S111, by a standardization coefficient (N1×N2−1) are subtracted from the pixel signals of the photographed image, which are generated in Step S112. In this manner, pixel signals of the parallax image corresponding to one of the non-light receiving pupil subregions 601a to 609a of the imaging optical system are generated.

Steps S111 to S113 may be executed for each subpixel in each unit pixel (Step S114) to obtain pixel signals of a plurality of (N1×N2) parallax images corresponding to the non-light receiving pupil subregions 601a to 609a of the imaging optical system.

With the image pickup element according to this embodiment described above and the image pickup apparatus to which the image pickup element is applied, the reduction in light receiving sensitivity of the image pickup element may be suppressed, and the plurality of parallax images may be obtained using the output of the image pickup element.

[Modified Example of First Embodiment]

Figure 12:
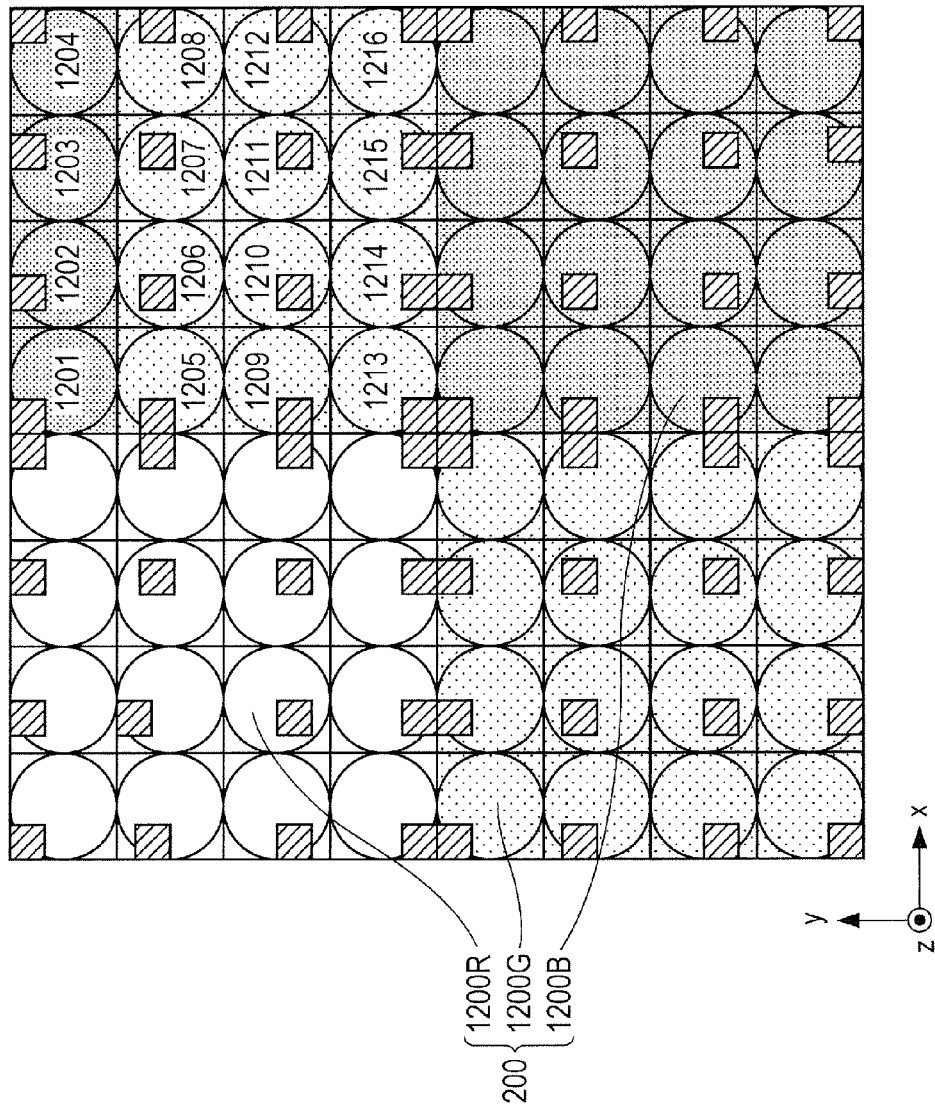
FIG. 12 is a schematic plan view of a pixel matrix in an image pickup element according to a modified example of the first embodiment of the present invention.

Next, a modified example of the first embodiment is described with reference to FIG. 12. This modified example presents, in the first embodiment, a configuration of an image pickup element in which the number of subpixels forming a unit pixel is changed. FIG. 12 is a schematic plan view of a matrix of unit pixels and subpixels of the image pickup element according to this modified example. A configuration of the subpixels and a configuration of the image pickup apparatus except for a configuration of the shielding layers are similar to those of the first embodiment, and hence a description thereof is omitted here.

FIG. 12 is a diagram illustrating the unit pixels of the image pickup element in a range of two rows by two columns (a range of eight rows by eight columns for the subpixels) when the unit pixel is formed of a matrix of 4×4 subpixels. In an actual image pickup element according to this modified example, a large number of the matrices of 2×2 unit pixels (8×8 subpixels) illustrated in FIG. 12 are arranged on the image pickup plane to allow a subject image to be photographed (photoelectrically converted). In this modified example, an image pickup element having a pixel period ΔX of 12 μm and the number of valid pixels of 3,000 columns in width by 2,000 rows in height, which totals 6,000,000 pixels (subpixel period Δx of 3 μm and the number of valid subpixels of subpixels of 12,000 columns in width by 8,000 rows in height, which totals 96,000,000 subpixels) is described.

However, as in the first embodiment, a specific configuration scale of the image pickup element is not limited thereto.

In this modified example, in a group of 2×2 unit pixels 1200 illustrated in FIG. 12, a pixel 1200R having a spectral sensitivity of red (R) is arranged at the upper left position of the figure, and pixels 1200G having a spectral sensitivity of green (G) are arranged at the upper right and lower left. Moreover, a pixel 1200B having a spectral sensitivity of blue (B) is arranged at the lower right. Further, each unit pixel is formed of N1×N2 (4×4) subpixels 1201 to 1216.

This modified example is an example of the image pickup element which obtains 4×4=16 parallax images, and hence there are sixteen arrangement patterns of shielding portions of the shielding layers as illustrated in FIG. 12. Configurations other than these are similar to those in the first embodiment, and hence a description thereof is omitted here.

According to the configuration of this modified example, the parallax images corresponding to the divided pupil regions obtained by a larger number of pupil divisions may be obtained while suppressing the reduction in light receiving sensitivity of the image pickup element.

[Second Embodiment]

Figure 13:
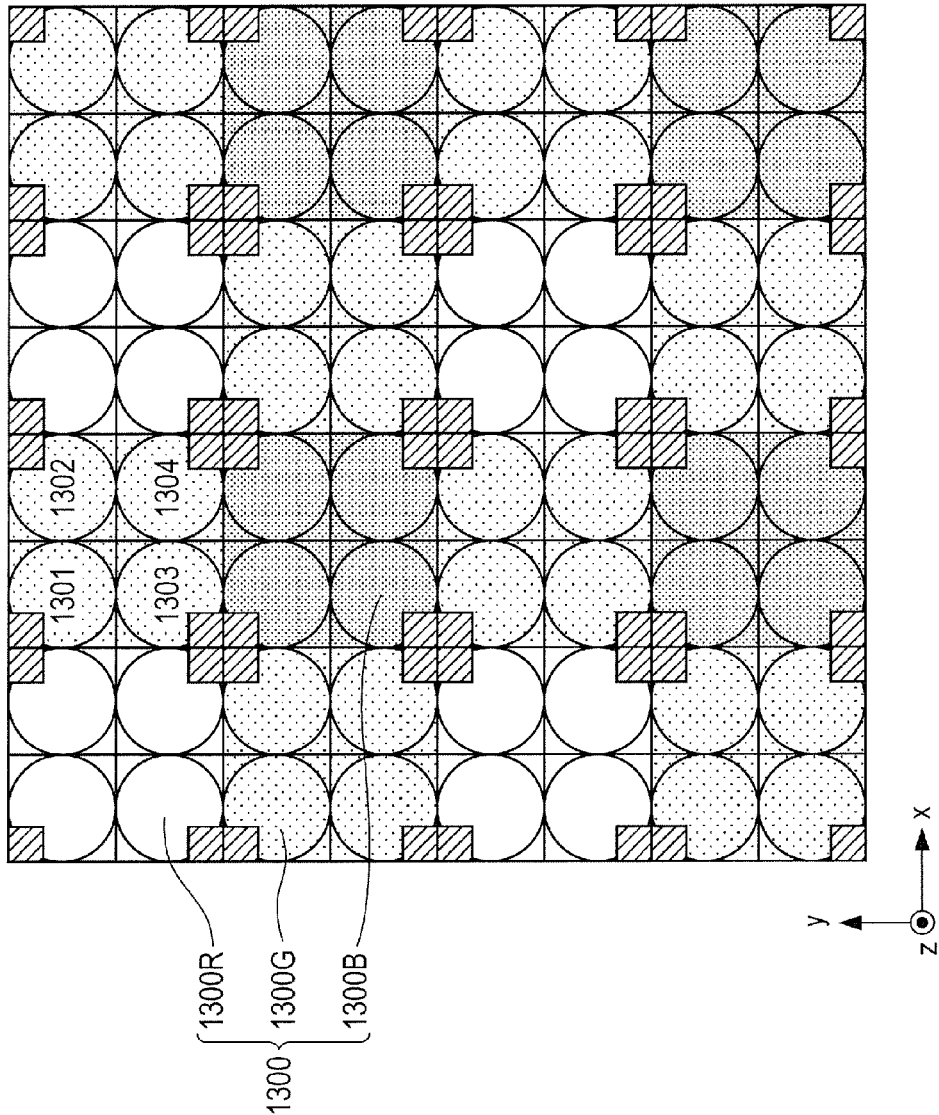
FIG. 13 is a schematic plan view of a pixel matrix in an image pickup element according to a second embodiment of the present invention.

A configuration of an image pickup element according to a second embodiment of the present invention is described with reference to FIGS. 13, 14A and 14B. FIG. 13 is a diagram illustrating a matrix of unit pixels of the image pickup element (two-dimensional CMOS sensor) according to this embodiment in a range of four rows by four columns.

In this embodiment, the unit pixel is formed of a matrix of 2×2 subpixels. Therefore, the number of divisions of the exit pupil is 2×2=4, and there are also four arrangement patterns of shielding portions. Moreover, as described below, the subpixel includes, in addition to the shielding layer according to the present invention, in order to improve photoelectric conversion efficiency, an inner-layer lens and an optical waveguide for condensing incident light and guiding the light to the photoelectric conversion element.

In an actual image pickup element according to this embodiment, a large number of the matrices of 4×4 unit pixels (matrices of 8×8 subpixels) illustrated in FIG. 13 are arranged on the image pickup plane to allow a subject image to be photographed (photoelectrically converted). In this embodiment, an image pickup element having a pixel period ΔX of 5 μm and the number of valid pixels of 4,500 columns in width by 3,000 rows in height, which totals 13,500,000 pixels (subpixel period Δx of 2.5 μm and the number of valid subpixels of 9,000 columns in width by 6,000 rows in height, which totals 54,000,000 subpixels) is described. However, as in the first embodiment, a specific configuration scale of the image pickup element is not limited thereto.

Moreover, in this embodiment, as illustrated in FIG. 13, in a group of 4×4 unit pixels 1300, a pixel 1300R having a spectral sensitivity of red (R) is arranged at the upper left position of the figure, and pixels 1300G having a spectral sensitivity of green (G) are arranged at the upper right and the lower left. Moreover, a pixel 1300B having a spectral sensitivity of blue (B) is arranged at the lower right. Further, each unit pixel is formed of a two-dimensional matrix of N1×N2 (2×2) subpixels 1301 to 1304.

Taking as an example one subpixel 1304 of the unit pixel 1300G of the image pickup element illustrated in FIG. 13, a configuration of the subpixel of the image pickup element according to this embodiment is described with reference to FIGS. 14A and 14B. FIG. 14A is a plan view when viewed from the light receiving surface side (+z side) of the image pickup element, and FIG. 14B is a cross-sectional view taken along the line 14B-14B in FIG. 14A when viewed from the −y side. In FIGS. 14A and 14B, similar parts as those in the first embodiment are denoted by the same reference symbols.

Figure 14A:
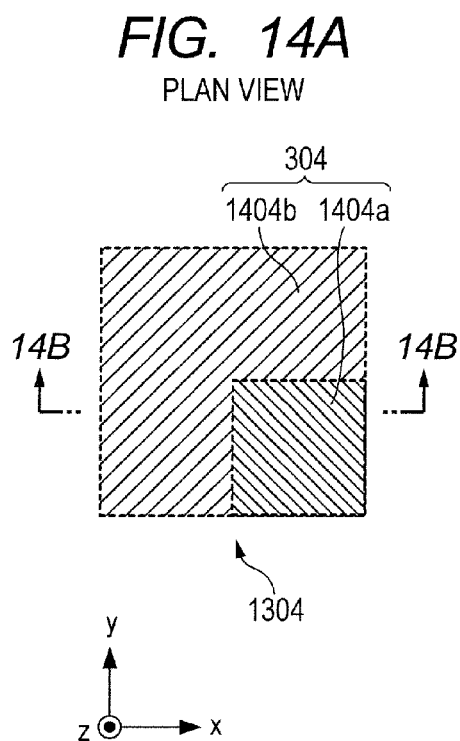
FIGS. 14A and 14B are a schematic plan view and a schematic cross-sectional view, respectively, of a subpixel included in the image pickup element according to the second embodiment of the present invention.
Figure 14B:
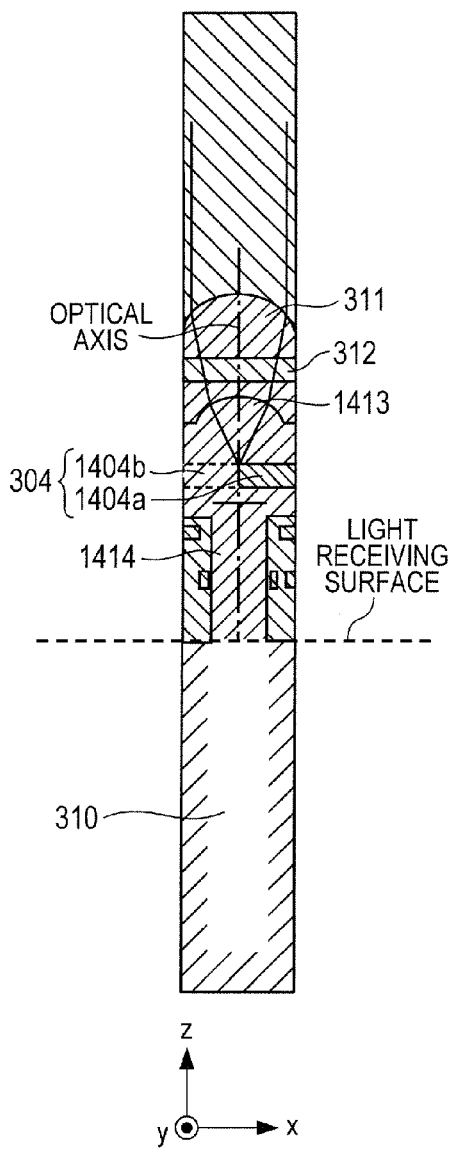

In FIGS. 14A and 14B, the subpixel 1304 includes the microlens 311 arranged on the light receiving surface side of a photoelectric conversion portion to condense the incident light, and the color filter 312 between the microlens 311 and the photoelectric conversion portion 310. Note that, the spectral transmittance of the color filter may be changed for each subpixel, or the color filter may be omitted as necessary.

As illustrated in FIG. 14B, the subpixel of the image pickup element according to this embodiment includes an inner-layer lens 1413 and an optical waveguide 1414, which are formed of a material having a high refractivity, between the microlens 311 and the photoelectric conversion portion 310. It is desired to arrange the light receiving surface of the optical waveguide 1414 in a depth of focus of the microlens, which is a combined system of the microlens 311 and the inner-layer lens 1413.

Further, the subpixel 1304 includes a shielding layer 1404, which consists of an aperture portion 1404b and a shielding portion 1404a, between the inner-layer lens 1413 and the optical waveguide 1414, and shields a part of the light receiving surface of the optical waveguide 1414. In order to shield light by the shielding layer 1404 more effectively, it is desired to form the shielding layer 1404 in the depth of focus of the microlens, which is the combined system of the microlens 311 and the inner-layer lens 1413.

As illustrated in FIG. 14A, also in this embodiment, the shielding layer 1404 is configured so that an area of the aperture portion 1404b is larger than an area of the shielding portion 1404a. A layout of the shielding portion 1404a forming the shielding layer 1404 is set as in the first embodiment and the modified example thereof depending on the number of subpixels forming the unit pixel. Configurations of the subpixels 1301 to 1304 in FIG. 13 are similar to that of the subpixel 1304 in FIG. 14A except that the arrangement position of the shielding portion 1404a is different depending on the position in the matrix of the subpixel.

As described above, in the image pickup element in this embodiment, the subpixel is the image pickup element which has an optical waveguide structure and obtains 2×2=4 parallax images. Configurations other than these are similar to those in the first embodiment, and hence a description thereof is omitted here.

Also with the image pickup element according to the second embodiment described above, the parallax images respectively corresponding to a larger plurality of divided pupil regions may be obtained while suppressing the reduction in light receiving sensitivity of the image pickup element. In particular, each of the subpixels includes the inner-layer lens and the optical waveguide, with the result that the reduction in light receiving sensitivity may be further suppressed.

According to the present invention, there may be provided the image pickup element in which the shielding layer is formed in the light receiving surface of the photoelectric conversion portion of each pixel to divide the pupil, and which allows the plurality of parallax images to be obtained while suppressing the reduction in light receiving sensitivity, and the image pickup apparatus.

Other Embodiments

The object of the present invention is also achieved by supplying a storage medium having recorded thereon program code of software, which realizes the functions of the embodiments described above, to a system or an apparatus. More specifically, it should be apparent that the object of the invention of the subject application is realized also by a computer (or a central processing unit (CPU) or a micro-processing unit (MPU)) of the system or the apparatus reading out and executing the program code stored in the storage medium.

In this case, the program code itself, which is read out from the storage medium, realizes the functions of the embodiments described above, and the program code itself and the storage medium having the program code stored thereon constitute the present invention.

As the storage medium for supplying the program code, for example, a flexible disk, a hard disk, an optical disk, a magneto-optical disk, a compact disc read-only memory (CD-ROM), a compact disc-rewritable (CD-R), a magnetic tape, a non-volatile memory card, a read-only memory (ROM), or the like may be used.

Moreover, the functions of the embodiments described above are realized also by a basic system or operating system (OS) or the like, which is operating on the computer, performing a part or all of actual processing based on instructions of the program code read out by the computer. It should be apparent that this case is also encompassed by the invention of the subject application.

Further, the processing based on the instructions of the program code read out from the storage medium after the program code is written on a memory included in a function expansion board inserted in the computer or a function expansion unit connected to the computer is also encompassed by the invention of the subject application. More specifically, it should be apparent that the case where the CPU or the like included in the function expansion board or the function expansion unit performs a part or all of the actual processing based on the instructions of the program code to realize the functions of the embodiments described above is also encompassed by the invention of the subject application.

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-060086, filed Mar. 24, 2014, which is hereby incorporated by reference herein in its entirety.

What is claimed is:

1. An image pickup element, comprising:
a pixel matrix in which a plurality of pixels each comprising a photoelectric conversion portion for photoelectrically converting an optical image of a subject, which is formed by an imaging optical system, the plurality of pixels are arranged in units of a matrix of a predetermined number of pixels;
a pupil dividing portion arranged on a side of a light receiving surface of the photoelectric conversion portion of each of the plurality of pixels to divide a pupil region of the imaging optical system; and
a shielding portion arranged between the pupil dividing portion and the photoelectric conversion portion of each of the plurality of pixels to shield a predetermined region of the light receiving surface of the photoelectric conversion portion,
wherein the predetermined region of each of the plurality of pixels included in the matrix of the predetermined number of pixels corresponds to any one of a predetermined number of divided pupil regions obtained when the pupil region is divided by the pupil dividing portion, and a proportion of the predetermined region in the light receiving surface is smaller than a proportion of a region that is not shielded by the shielding portion in the light receiving surface.

2. An image pickup element according to claim 1, wherein each of the plurality of pixels further comprises a lens portion between the pupil dividing portion and the shielding portion, and an optical waveguide portion between the shielding portion and the light receiving surface, and wherein the lens portion and the optical waveguide portion are formed of a material having a high refractivity.

3. An image pickup element according to claim 1, wherein the pupil dividing portion comprises a microlens.

4. An image pickup element according to claim 1, wherein each of the plurality of pixels further comprises a color filter between the pupil dividing portion and the shielding portion, and wherein the color filters included in the pixels included in the matrix of the predetermined number of the pixels have a same spectral sensitivity.

5. An image pickup element according to claim 1, wherein correspondences between the predetermined regions and the divided pupil regions of the predetermined number of pixels are repeated in units of the matrix of the predetermined number of the pixels.

6. An image pickup apparatus, comprising:
the image pickup element of claim 1;
an image processing unit that processes a pixel signal output from each of the plurality of pixels of the image pickup element; and
a control unit that controls the image processing unit to generate a pixel signal of a parallax image corresponding to a divided pupil region corresponding to the predetermined region,
wherein the control for generating the pixel signal of the parallax image includes:
a control for adding pixel signals output from the plurality of pixels for each of a predetermined number of matrices of the pixels to generate a pixel signal of a photographed image of the subject;

a control for obtaining a pixel signal output from a predetermined pixel for each of the matrices of the predetermined number of the pixels to generate a pixel signal of an original parallax image; and a control for subtracting the pixel signal of the original parallax image, which is multiplied by a predetermined coefficient, from the pixel signal of the photographed image to generate the pixel signal of the parallax image.

7. An image processing method for processing a pixel signal output from each pixel of an image pickup element, the image pickup element comprising:

a pixel matrix in which a plurality of pixels each comprising a photoelectric conversion portion for photoelectrically converting an optical image of a subject, which is formed by an imaging optical system, the plurality of pixels are arranged in units of a matrix of a predetermined number of pixels;

a pupil dividing portion arranged on a side of a light receiving surface of the photoelectric conversion portion of each of the plurality of pixels to divide a pupil region of the imaging optical system; and a shielding portion arranged between the pupil dividing portion and the photoelectric conversion portion of each of the plurality of pixels to shield a predetermined region of the light receiving surface of the photoelectric conversion portion, the predetermined region of each of the plurality of pixels included in the matrix of the predetermined number of pixels corresponding to any one of a predetermined number of divided pupil regions obtained when the pupil region is divided by the pupil dividing portion, the image processing method comprising:

adding pixel signals output from the plurality of pixels for each of a predetermined number of matrices of the plurality of pixels to generate a pixel signal of a photographed image of the subject;

obtaining a pixel signal output from a predetermined pixel for each of the matrices of the predetermined number of the pixels to generate a pixel signal of an original parallax image; and subtracting the pixel signal of the original parallax image, which is multiplied by a predetermined coefficient, from the pixel signal of the photographed image to generate a pixel signal of a parallax image.

8. A non-transitory computer readable storage medium having stored thereon a program for causing a computer to execute the image processing method of claim 7.

\* \* \* \* \*